(12) United States Patent
Uchino (10) Patent No.: US 7,960,823 B2
(45) Date of Patent: Jun. 14, 2011

(54) SEMICONDUCTOR DEVICE WITH DIFFERENT SIZED ESD PROTECTION ELEMENTS

(75) Inventor: Yukinori Uchino, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 559 days.

(21) Appl. No.: 12/055,869

(22) Filed: Mar. 26, 2008

(65) Prior Publication Data

US 2008/0237645 A1     Oct. 2, 2008

(30) Foreign Application Priority Data

Mar. 27, 2007    (JP) ................................ 2007-082871

(51) Int. Cl.
*H01L 23/52*      (2006.01)
(52) U.S. Cl. ........................................ 257/691; 257/692
(58) Field of Classification Search .................. 257/691, 257/692

See application file for complete search history.

(56) References Cited

U.S. PATENT DOCUMENTS

| 6,411,485 B1 | 6/2002 | Chen et al. |
| 7,076,757 B2 | 7/2006 | Hirata |

FOREIGN PATENT DOCUMENTS

| JP | 06089973 | 3/1994 |
| JP | 2000208706 | 7/2000 |
| JP | 2003229533 | 8/2003 |
| JP | 2006080145 | 3/2006 |
| JP | 2007005817 | 1/2007 |

OTHER PUBLICATIONS

Japanese Office Action dated Jun. 30, 2009, corresponding to U.S. Appl. No. 12/055,869, filed on Mar. 26, 2008.

*Primary Examiner* — Thanh V Pham
(74) *Attorney, Agent, or Firm* — Turocy & Watson, LLP

(57) ABSTRACT

A semiconductor device of an aspect of the present invention comprises a package substrate, one first power supply terminal provided on the package substrate, one second power supply terminal provided on the package substrate, a semiconductor chip disposed on the package substrate, first and second internal power supply circuits provided in the semiconductor chip, one first ESD protection element which is provided in the first internal power supply circuit and which is connected to the first power supply terminal, and a plurality of second ESD protection elements, the second ESD protection elements being provided in the second internal power supply circuit, the size of one second ESD protection element being smaller than that of the first ESD protection element, the second ESD protection elements being connected to the common second power supply terminal.

5 Claims, 11 Drawing Sheets

SEMICONDUCTOR DEVICE WITH DIFFERENT SIZED ESD PROTECTION ELEMENTS

CROSS-REFERENCE TO RELATED APPLICATIONS

This application is based upon and claims the benefit of priority from prior Japanese Patent Application No. 2007-082871, filed Mar. 27, 2007, the entire contents of which are incorporated herein by reference.

BACKGROUND OF THE INVENTION

1. Field of the Invention

The present invention relates to a semiconductor device, and more particularly, it relates to the layout of ESD protection elements used in a semiconductor chip.

2. Description of the Related Art

Recently, demands for portable electronic devices such as mobile telephones, portable information processing terminal devices and small audio devices have been rapidly increasing.

In order to meet these demands, attempts are made to reduce the size, weight and thickness of a semiconductor device.

Therefore, in semiconductor devices, use is made of a system-on-chip (SOC) technique in which a plurality of systems are stored in one semiconductor chip and a multi-chip package (MCP) technique in which a plurality of semiconductor chips such as LSI chips or memory chips are stacked on one package substrate.

The LSI chip has a plurality of pads which are connected to the external terminal of the package substrate. In the LSI chip, a power supply circuit having an electrostatic discharge (ESD) protection element with predetermined ESD resistance is connected to a substrate pad or a power supply ring on the package substrate via a bonding pad or wire.

Thus, internal circuits in the LSI chip are protected against an ESD breakdown current.

Recently, the miniaturization of a MOS transistor has been carried out, and the ESD resistance of the gate oxide film of the MOS transistor keeps decreasing. Therefore, the size and number of the ESD protection elements in the chip tend to be increased in order to ensure ESD resistance sufficient to prevent the breakdown and defect of the LSI chip.

In products with high power consumption, a large number of power supply terminals are used, and the size and number of the ESD protection elements are therefore increasing. Moreover, a plurality of ESD protection elements are provided in various places within the chip in consideration of the wiring layout on the package substrate.

This increases the size of the semiconductor chip, and it is difficult to make the chips and a package device using these chips smaller.

BRIEF SUMMARY OF THE INVENTION

A semiconductor device of an aspect of the present invention comprises: a package substrate; one first power supply terminal provided on the package substrate; one second power supply terminal provided on the package substrate; a semiconductor chip disposed on the package substrate; first and second internal power supply circuits provided in the semiconductor chip; one first ESD protection element which is provided in the first internal power supply circuit and which is connected to the first power supply terminal; and a plurality of second ESD protection elements, the second ESD protection elements being provided in the second internal power supply circuit, the size of one second ESD protection element being smaller than that of the first ESD protection element, the second ESD protection elements being connected to the common second power supply terminal.

A semiconductor device of an aspect of the present invention comprises: a package substrate; at least one power supply terminal provided on the package substrate; a first semiconductor chip which is disposed on the package substrate and which has a first internal power supply circuit; one first ESD protection element provided in the first internal power supply circuit; a second semiconductor chip which is disposed side by side with the first semiconductor chip on the package substrate and which has a second internal power supply circuit; and a plurality of second ESD protection elements, the second ESD protection elements being provided in the second internal power supply circuit, the size of one second ESD protection element being smaller than that of the first ESD protection element, the second ESD protection elements being connected to the one common power supply terminal.

A semiconductor device of an aspect of the present invention comprises: a package substrate; at least one power supply terminal provided on the package substrate; a first semiconductor chip which is disposed on the package substrate and which has a first internal power supply circuit; a plurality of first ESD protection elements which are provided in the first internal power supply circuit and which are connected to the power supply terminal; a second semiconductor chip which is disposed on the first semiconductor chip and which has a second internal power supply circuit; and a plurality of second ESD protection elements, the second ESD protection elements being provided in the second internal power supply circuit, the size of the second ESD protection element being smaller than that of the first ESD protection element, the second ESD protection elements being connected to the plurality of first ESD protection elements.

DETAILED DESCRIPTION OF THE INVENTION

1. Outline

Semiconductor devices according to embodiments of the present invention relate to the layout of ESD protection elements in a semiconductor chip.

The semiconductor chip described in the embodiments of the present invention is characterized by having a first ESD protection element connected to an external terminal one-to-one, and a plurality of second ESD protection elements which are smaller (occupy less area) than the first ESD protection element and which are connected to one common power supply terminal.

In this case, as the plurality of second ESD protection elements are connected to the one common power supply terminal, an ESD breakdown current is supplied to the plurality of second ESD protection elements in a shunted manner. Thus, the ESD resistance of one second ESD protection element has only to be so high as to be able to resist the intensity of the shunted ESD breakdown current.

Thus, these ESD protection elements can be smaller than the first ESD protection elements connected one-to-one to the one common power supply terminal.

Therefore, the size of all the ESD protection elements in the chip does not have to be the same as the size of the first ESD protection element as has heretofore been the case, so that the size of an internal power supply circuit can be reduced.

It is thus possible to reduce the size of the semiconductor chip.

Furthermore, the embodiments of the present invention are also described in connection with an example where the above-mentioned layout of the ESD protection elements is used in an MCP apparatus in which two or more semiconductor chips are provided in a package substrate. In this case, the size of the MCP apparatus can be reduced.

2. Embodiments (1) First Embodiment (a) Basic Example

One example of a semiconductor device according to a first embodiment of the present invention is described with reference to FIGS. 1 to 3.

Figure 1:
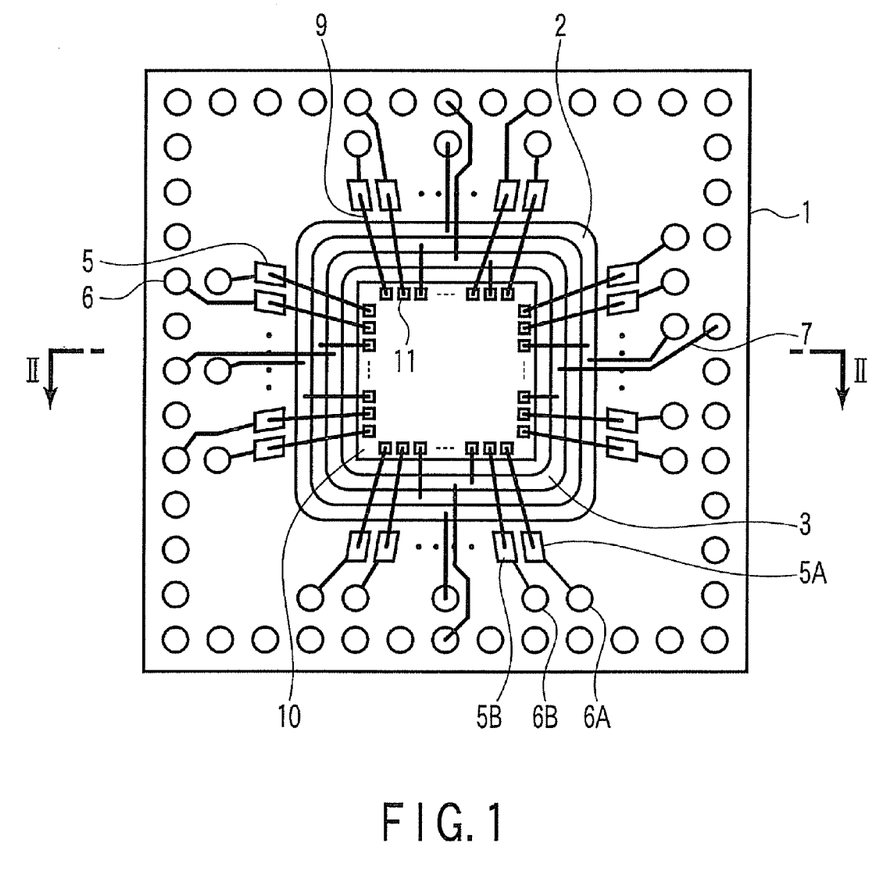
FIG. 1 is a plan view showing one example of a first embodiment.
Figure 2:
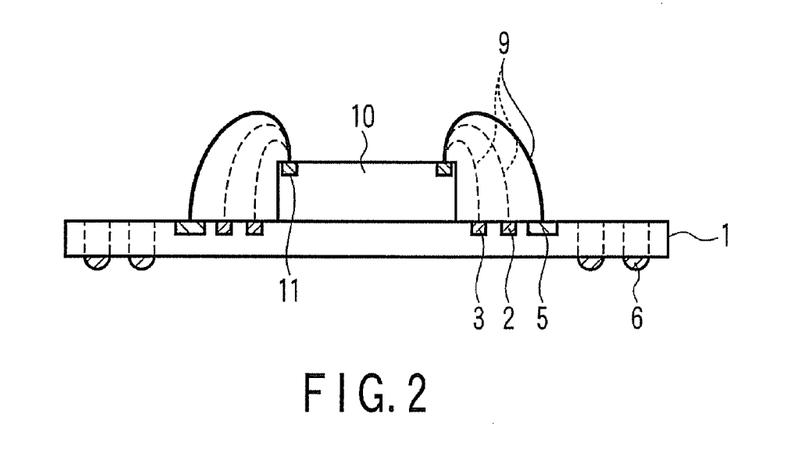
FIG. 2 is a sectional view along line II-II in FIG. 1.

FIG. 1 is a plan view showing the entire semiconductor device in the present embodiment, and FIG. 2 is a sectional view along line II-II in FIG. 1. In addition, members in a depth or forward direction are indicated by broken lines in FIG. 2. Moreover, substrate wiring lines 7 are not shown in FIG. 2.

As shown in FIGS. 1 and 2, one semiconductor chip 10 is disposed one on a package substrate 1, for example, via a thin insulating sheet (not shown). The package substrate 1 is, for example, a ball grid array (BGA) substrate. In addition, the package substrate 1 is not limited to the BGA substrate, and may be a different package substrate such as a quad flat package (QFP) substrate.

A plurality of substrate pads 5, 5A, 5B and a plurality of external terminals 6, 6A, 6B are provided in the package substrate 1. The plurality of substrate pads 5, 5A, 5B are connected to the plurality of external terminals 6, 6A, 6B by the substrate wiring lines 7 formed on the top surface of the package substrate 1 or in the package substrate 1. In addition, the primary substrate wiring lines 7 are only shown in FIG. 1.

The semiconductor chip 10 is, for example, an LSI chip. In addition, the semiconductor chip is not limited thereto, and may be a memory chip such as a flash memory or dynamic random access memory (DRAM) or an embedded chip consolidating a memory and an LSI. The LSI chip is described below as an example.

A plurality of pads 11 are provided in the semiconductor chip 10. The plurality of pads 11 are connected to the substrate pads 5, 5A and 5B on the package substrate 1 by bonding wires 9. Thus, the input/output of data and the supply of a first power supply voltage (hereinafter referred to as VDD1) or a first ground voltage (hereinafter referred to as VSS1) from the outside into the LSI chip 10 are carried out.

Furthermore, power supply terminals 2, 3 are provided on the package substrate 1, and these terminals are, for example, ring-shaped and provided to enclose the periphery of the semiconductor chip 10. The ring-shaped first and second power supply terminals 2, 3 are hereinafter referred to as first and second power supply rings 2, 3.

The first power supply ring 2 is supplied with, for example, a second power supply voltage (hereinafter referred to as VDD2), and the second power supply ring 3 is supplied with, for example, a second ground voltage (hereinafter referred to as VSS2). VDD2 and VSS2 may have voltage values different from those of VDD1 and VSS1 or may have the same voltage values as those of VDD1 and VSS1. As shown in FIGS. 1 and 2, the power supply rings 2, 3 are provided on the package substrate 1, such that a plurality of terminals of the semiconductor chip can be easily connected to the one common terminal on the package substrate 1.

The LSI chip 10 has a plurality of internal power supply circuits (not shown) and internal circuits (not shown) designed to correspond to predetermined power supply voltage systems. The plurality of internal power supply circuits convert therein VDD1 or VDD2 into a predetermined internal voltage. The plurality of internal circuits are, for example, logical circuits, chip control circuits or memory circuits, and uses the voltage converted by the internal power supply circuits as a driving voltage. Hereinafter, for simplicity, two power supply voltage systems are described, and the layout of ESD protection elements in the embodiment of the present invention is described in connection with a first internal power supply circuit 20 and a second internal power supply circuit 30.

Figure 3:
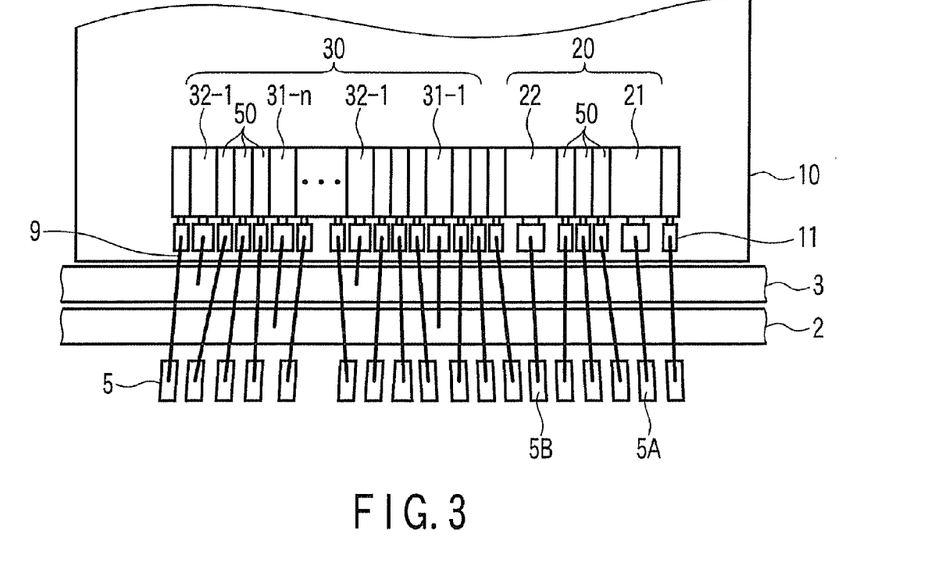
FIG. 3 is a schematic diagram showing the layout of ESD protection elements in the first embodiment.

FIG. 3 is a schematic diagram of a part of the LSI chip 10 on the package substrate 1 shown in FIGS. 1 and 2 extracted in the vicinity of the internal power supply circuits.

A plurality of input/output circuits 50 and a plurality of ESD protection elements 21, 22, 31-1, 32-1, 31-$n$, 32-$n$ are provided in the first and second internal power supply circuits 20, 30.

The input/output circuits 50 are responsible for the input/output of signals, and a plurality of input/output circuits 50 are provided in the first and second internal power supply circuits 20, 30. The input/output circuits 50 are then connected to the substrate pads 5 on the package substrate 1 via the chip pads 11 and bonding wires 9.

The ESD protection elements 21, 22 for VDD1 and VSS2 are provided in the first internal power supply circuit 20. In addition, one first ESD protection element is enough for one power source, but the number of first ESD protection elements is not limited.

The first ESD protection elements 21, 22 are connected to the substrate pads (first power supply pads) 5A, 5B on the package substrate 1 via the chip pads 11 and the bonding wires 9. Then, the substrate pads 5A, 5B are connected to the external terminals 6A, 6B for VDD1 and VSS1 via the substrate wiring lines 7 in FIG. 1. Thus, VDD1 and VSS1 are supplied to the first internal power supply circuit 20.

The first ESD protection elements 21, 22 are connected to the substrate pads 5A, 5B one-to-one, and large elements are used so that a predetermined ESD resistance standard required by the internal circuit is satisfied.

On the other hand, a plurality of second ESD protection elements 31-1, 31-*n* for VDD2 and a plurality of second ESD protection elements 32-1, 32-*n* for VSS2 are provided in the second internal power supply circuit 30. In addition, two second ESD protection elements 31-1, 31-*n* and two second ESD protection elements 32-1, 32-*n* are shown for simplicity in FIG. 3, but a plurality of (n) ESD protection elements are provided in the power supply circuit 30.

Two or more second ESD protection elements 31-1, 31-*n* and two or more second ESD protection elements 31-1, 32-*n* are provided for VDD2 and VSS2, respectively. These ESD protection elements are connected to the common power supply rings (second power supply rings) 2, 3 on the package substrate 1 via the chip pads 11 and the bonding wires 9. These power supply rings 2, 3 are connected to the external terminals for VDD2 and VSS2 via the substrate wiring lines 7 and the bonding wires 9. Thus, VDD2 and VSS2 are supplied into the second internal power supply circuit 30.

Elements smaller (occupying less area) than the first ESD protection elements 21, 22 are used for the second ESD protection elements 31-1, 31-*n*, 31-1, 32-*n*, and one second ESD protection element does not satisfy the predetermined ESD resistance standard required by the internal circuit.

As described above, the size (area) of the first ESD protection elements 21, 22 connected to the external terminals one-to-one satisfies the predetermined ESD resistance standard. Moreover, each of the plurality of second ESD protection elements 31-1, 31-*n*, 31-1, 32-*n* connected to the common power supply rings is smaller (occupies less area) than the first ESD protection element.

As the first ESD protection elements 21, 22 are connected to the external pins 5A, 5B one-to-one, one element has to satisfy the ESD resistance standard.

On the other hand, as the second ESD protection elements 31-1, 31-*n*, 31-1, 32-*n* are small-sized, one element does not satisfy the predetermined ESD resistance standard, but the ESD resistance standard can be satisfied by a plurality of elements because these elements are connected to the common power supply rings 2, 3. The reason is that the ESD breakdown current applied to the power supply rings 2, 3 from the external terminals is supplied in a shunted manner to the second ESD protection elements 31-1, 31-*n*, 31-1, 32-*n* connected to the common power supply rings 2, 3. For example, when two second ESD protection elements are provided in the second internal power supply circuit 30, the ESD breakdown current applied from the power supply rings is shunted into halves, and the half of the ESD breakdown current is supplied to one second ESD protection element. That is, when n second ESD protection elements are provided in the second internal power supply circuit 30, 1/n of the ESD breakdown current is supplied to one second ESD protection element.

Thus, even if the size of one second ESD protection element is small, a plurality of ESD protection elements are connected to one common power supply ring such that the second internal power supply circuit 30 can ensure the predetermined ESD resistance.

The ESD resistance of the ESD protection element is determined by the size of the element, and a larger element provides higher ESD resistance. Here, when the first internal power supply circuit 20 and the second internal power supply circuit 30 satisfy much the same ESD resistance standard, the size of one first ESD protection element is much the same as a total size of a plurality of second ESD protection elements. For example, when two second protection elements are provided, the size of one second ESD protection element is half the size of the first ESD protection element. When n second protection elements are provided, the size of one second ESD protection element is 1/n times the size of the first ESD protection element. However, not all of a plurality of second ESD protection elements 31-1, 31-*n*, 32-1, 32-*n* provided in the same internal power supply circuit 30 have to be in the same size, and it is only necessary that the total size (area) of these elements be substantially greater than or equal to the size (area) of the first ESD protection element.

As described above, the semiconductor device in the first embodiment of the present invention is characterized in that one first ESD protection element and a plurality of second ESD elements are provided and that the second ESD protection elements are connected to one common power supply terminal.

Thus, even if the size (area) of a plurality of second ESD protection elements is smaller than the size (area) of the first ESD protection element connected to one power supply terminal one-to-one, the predetermined ESD resistance can be ensured.

Therefore, the size of the internal power supply circuit can be reduced, and the area of the LSI chip can be reduced.

Effects in the present embodiment are hereinafter described with FIGS. 4 and 5.

Figure 4:
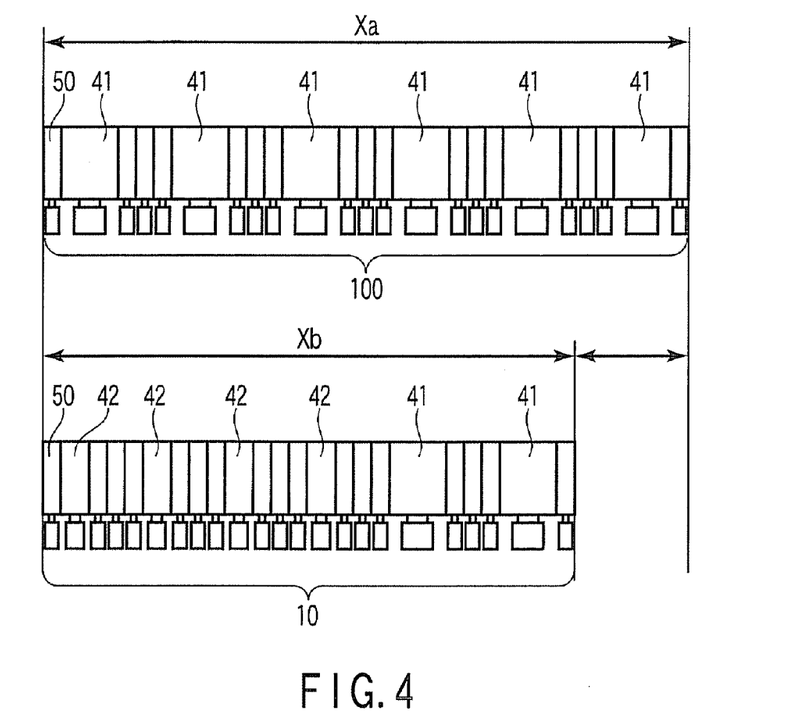
FIG. 4 is a plan view showing the effects in the first embodiment.

FIG. 4 is a schematic diagram showing one side of the LSI chip 10 of the present embodiment and one side of an LSI chip 100 of a traditional example. Further, FIG. 5 is a plan view showing the entire LSI chips 10, 100 of the present embodiment and the traditional example. In addition, six ESD protection elements are shown in each chip in FIG. 4, but the number of elements is not limited.

As shown in FIG. 4, ESD protection elements 41 provided in the LSI chip 100 have heretofore been configured by ESD protection elements which all satisfy the predetermined ESD resistance standard and which are all large-sized, including elements connected to external terminals one-to-one or elements connected to a common power supply ring. The length of one side of this LSI chip 100 of the traditional example is Xa.

On the other hand, the ESD protection elements 41 are connected to power supply terminals for VDD or VSS in the LSI chip 10 of the present embodiment. Thus, one ESD protection element 41 maintains the ESD resistance, so that an element with a large area is used. A plurality of ESD protection elements 42 are connected to one power supply terminal (power supply ring) for VDD or VSS. As an ESD breakdown current is supplied to each of the plurality of ESD protection elements 42 in a shunted manner, the resistance of one second ESD protection element 42 has only to resist the shunted ESD breakdown current. Therefore, the size of one second ESD protection element can be smaller than the size of one first ESD protection element. Thus, the length of one side of the LSI chip of the present embodiment can be Xb shorter than Xa.

Figure 5:
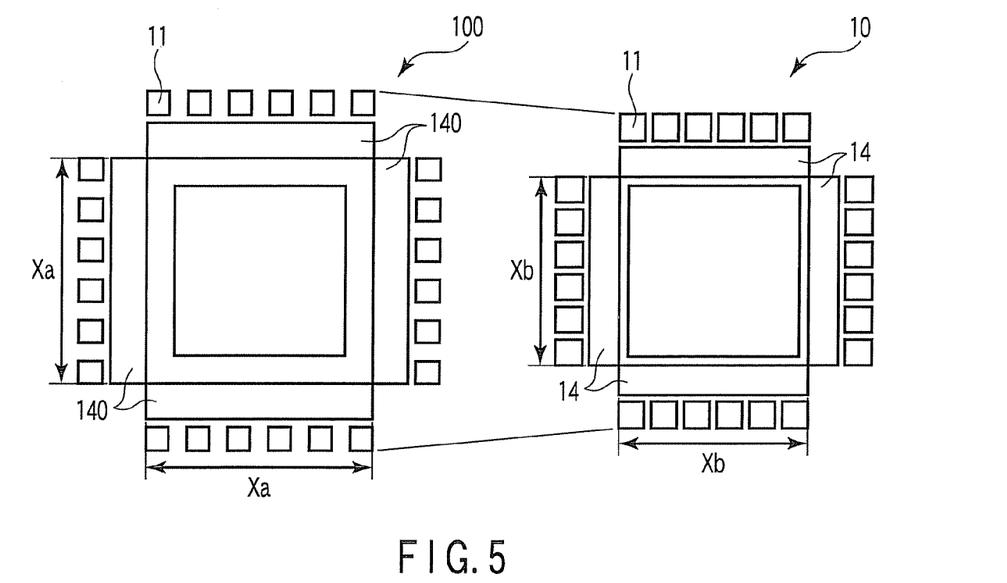
FIG. 5 is a plan view showing the effects in the first embodiment.

Therefore, as shown in FIG. 5, the size of an input/output region 14 including an internal power supply circuit of the present embodiment can be smaller than that of an input/output region 140 including an internal power supply circuit of the traditional example, so that the size of the LSI chip 10 can be smaller than the size of the LSI chip 100 of the prior art.

As described above, according to the embodiment of the present invention, the second ESD protection element connected to one common power supply ring is smaller than the first ESD protection element connected to the external power supply terminal one-to-one, such that the LSI chip (semiconductor chip) can be smaller.

(b) Modification

Figure 6:
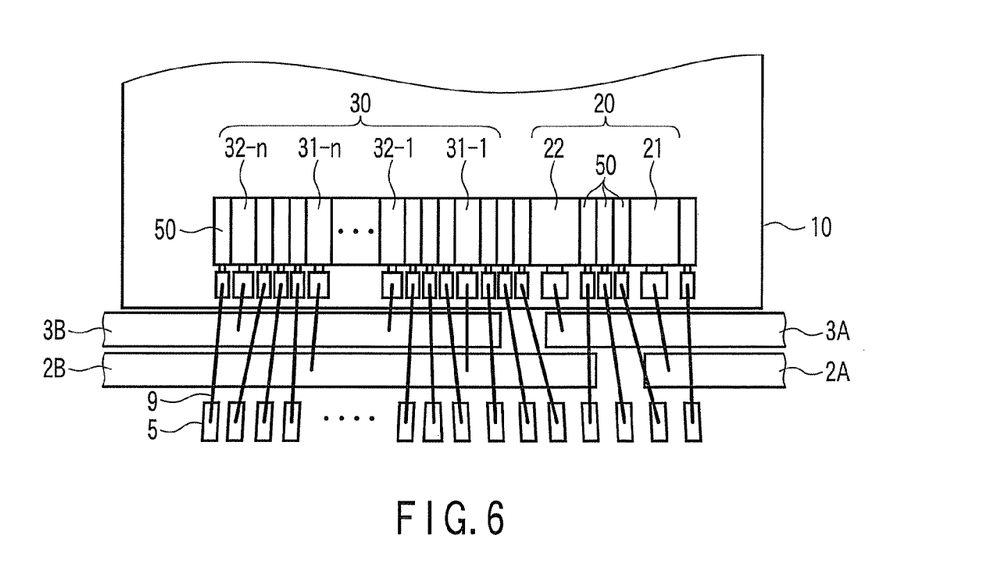
FIG. 6 is a plan view showing a modification of the first embodiment.

A modification of the present embodiment is described with FIG. 6. It is to be noted that the same reference numbers are assigned to the same members as those in Basic Example and that detailed explanations thereof are omitted.

In FIG. 6, power supply rings provided on a package substrate 1 are partly cut off, and separated into two pairs. Power supply rings 2A, 2B, 3A, 3B are electrically independent of one another, and each of them is connected to a different external terminal.

First ESD protection elements 21, 22 are large elements satisfying the ESD resistance standard, and are connected one-to-one to the power supply rings 2A, 3A divided for VDD1 and VSS1.

On the other hand, each of a plurality of second ESD protection elements 31-1, 31-n, 32-1, 32-n is smaller than one first ESD protection element 21, 22, and connected to the common power supply rings 2B, 3B divided for VDD2 and VSS2. Therefore, the ESD breakdown currents applied from the power supply rings 2B, 3B are supplied to the plurality of second ESD protection elements 31-1, 31-n, 32-1, 32-n in a shunted manner.

Therefore, the predetermined ESD resistance can be ensured even if the second ESD protection element is made smaller.

Thus, the size of the LSI chip can be reduced in the present modification as well.

(2) Second Embodiment

The case where one semiconductor chip is disposed on the package substrate has been described in the first embodiment.

However, as described above, a plurality of semiconductor chips may be disposed on one package substrate for higher integration of a package device.

An MCP apparatus having a structure in which a plurality of semiconductor chips are arranged side by side on one package substrate is described in the second embodiment of the present invention. It is to be noted that the same reference numbers are assigned to the same members as those in the first embodiment and that detailed explanations thereof are omitted.

The second embodiment of the present invention is hereinafter described with FIGS. 7 to 9.

Figure 7:
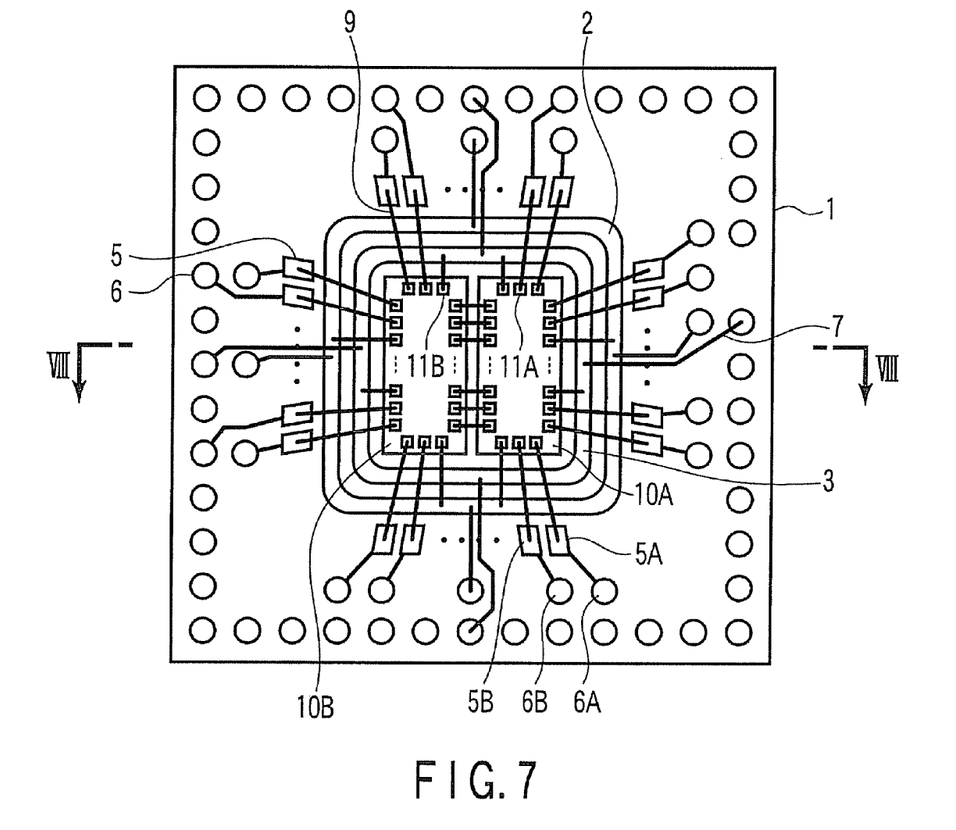
FIG. 7 is a plan view showing one example of a second embodiment.
Figure 8:
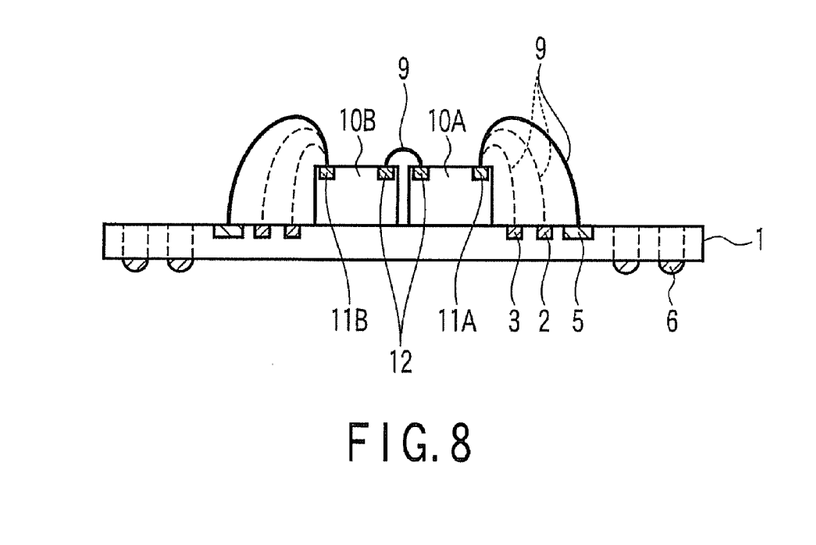
FIG. 8 is a sectional view along line VIII-VIII in FIG. 7.

FIG. 7 shows a plan view in the present embodiment, and FIG. 8 shows a sectional view along line VIII-VIII in FIG. 7.

In addition, members in a depth or forward direction are indicated by broken lines in FIG. 8, and substrate wiring lines 7 are not shown.

As shown in FIGS. 7 and 8, two semiconductor chips 10A, 10B are arranged side by side on a package substrate 1, for example, via a thin insulating sheet (not shown). The semiconductor chips 10A, 10B are, for example, LSI chips. In addition, in the present embodiment as well, the semiconductor chips are not limited to the LSI chips, and may be memory chips or embedded chips.

Power supply rings 2, 3 for VDD (power supply voltage) and VSS (ground voltage) are provided on the package substrate 1 to enclose the periphery of these two LSI chips 10A, 10B.

The LSI chips 10A, 10B have a plurality of chip pads 11A, 11B, 12 on their top surfaces. The plurality of chip pads 11A, 11B are connected to the power supply rings 2, 3 and substrate pads 5, 5A, 5B on the package substrate 1 via bonding wires 9.

The LSI chip (first semiconductor chip) 10A and the LSI chip (second semiconductor chip) 10B are connected to each other by the chip pads 12 via, for example, the bonding wires 9.

Figure 9:
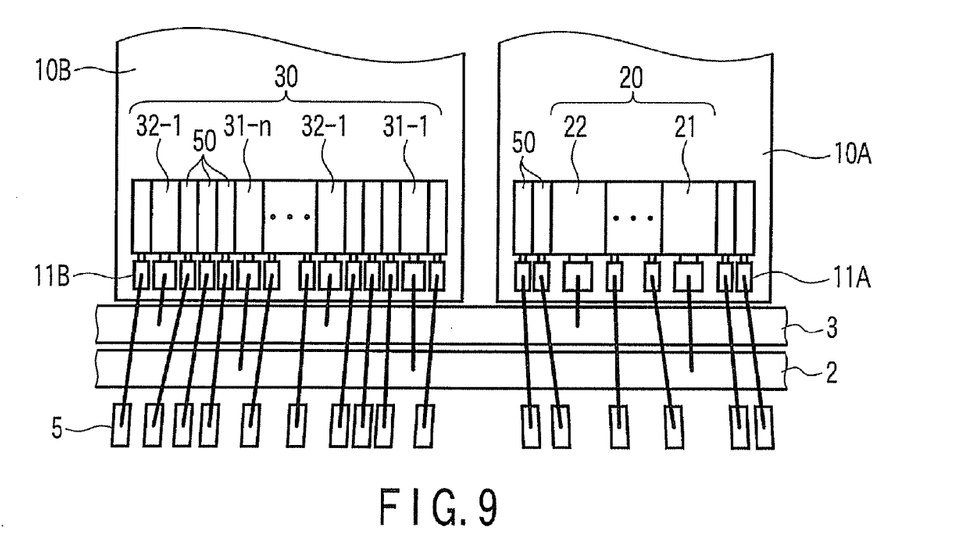
FIG. 9 is a schematic diagram showing the layout of ESD protection elements in the second embodiment.

FIG. 9 is a schematic diagram of parts of the package substrate 1 and the LSI chips 10A, 10B extracted in the vicinity of internal power supply circuits.

The LSI chip 10A has a first internal power supply circuit 20 therein. The first internal power supply circuit 20 has first ESD protection elements 21, 22 and a plurality of input/output circuits 50.

One first ESD protection element 21, 22 or a plurality of first ESD protection elements 21, 22 may be provided for VDD or VSS. The first ESD protection elements 21, 22 are connected to the power supply rings 2, 3, respectively.

The LSI chip 10B has a second internal power supply circuit 30 therein. The second internal power supply circuit 30 has a plurality of second ESD protection elements 31-1, 31-n, 32-1, 32-n and a plurality of input/output circuits 50.

The plurality of second ESD protection elements 31-1, 31-n, 32-1, 32-n are smaller than the first ESD protection elements 21, 22, and are connected to the common power supply rings 2, 3.

In the present embodiment as well, when an ESD breakdown current is applied to the second internal power supply circuit, the ESD breakdown current is supplied to the plurality of second ESD protection elements 31-1, 31-n, 32-1, 32-n in a shunted manner. Moreover, as the first ESD protection elements 21, 22 are also connected to the power supply rings 2, 3, the ESD breakdown current also runs to the first ESD protection elements 21, 22 in a shunted manner. Therefore, the predetermined ESD resistance standard required by the internal circuit can be ensured even if the size of the second ESD protection element 31-1, 31-n, 32-1, 32-n is reduced.

As described above, in the semiconductor device of the present embodiment, the size of the input/output region of the second LSI chip 10B can be reduced as in the first embodiment.

Thus, according to the second embodiment of the present invention, the size of the second LSI chip can be reduced, and the size of the MCP apparatus can be reduced.

In addition, while the example where two LSI chips are arranged side by side on the package substrate has been described in the present embodiment, the present embodiment is not limited in the number of LSI chips, and three or more LSI chips (semiconductor chips) may be arranged on the package substrate 1.

Moreover, while the power supply rings 2, 3 are provided on the package substrate 1 to enclose the periphery of the two LSI chips 10A, 10B, the power supply rings may be provided to enclose the periphery of one of the chips. Further, as in the modification of the first embodiment, the power supply rings 2, 3 may be partly cut off and electrically separated.

(3) Third Embodiment

The example of the MCP apparatus in which a plurality of semiconductor chips are arranged side by side on one package substrate has been described in the second embodiment.

In order to further reduce the size of the MCP apparatus, it is desirable to arrange a plurality of semiconductor chips on one package substrate in a stacked manner.

The present embodiment is described in connection with the case where a plurality of semiconductor chips are stacked on the package substrate. It is to be noted that the same reference numbers are assigned to the same members as those in the first and second embodiments and that detailed explanations thereof are omitted.

(a) First Structure

Figure 10:
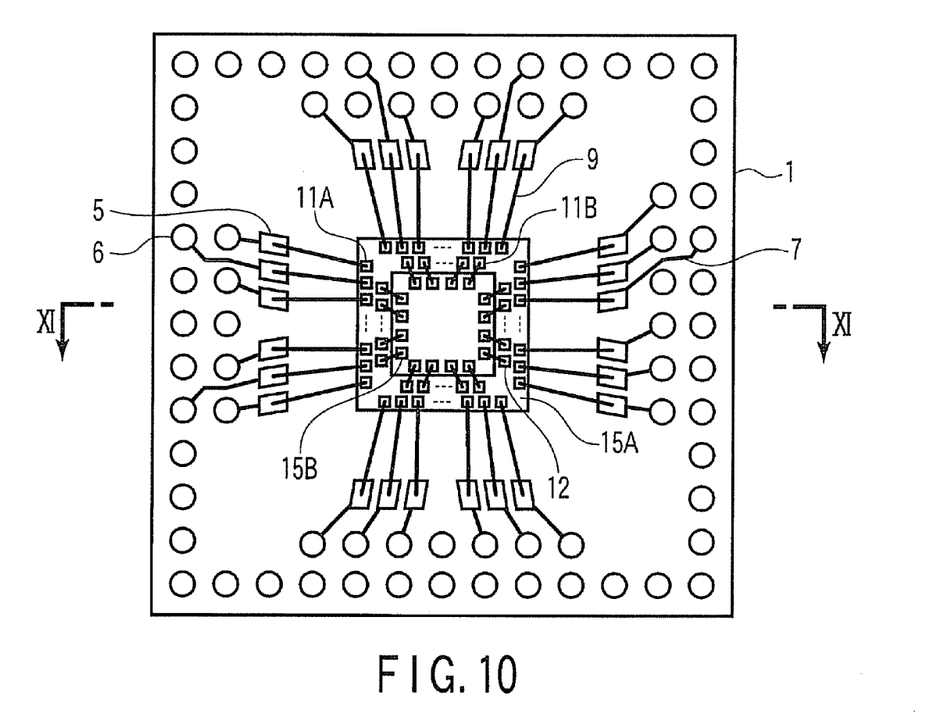
FIG. 10 is a plan view showing one structural example of a third embodiment.
Figure 11:
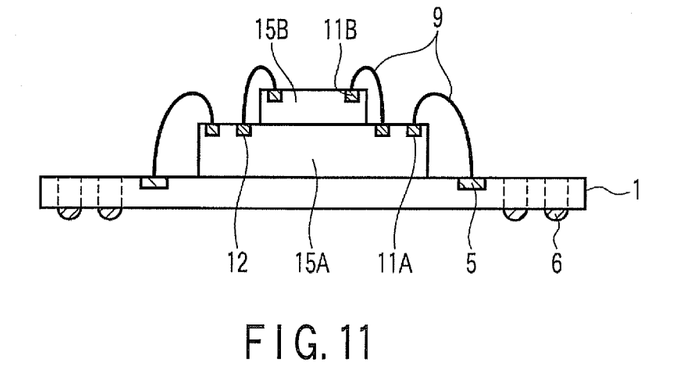
FIG. 11 is a sectional view along line XI-XI in FIG. 10.
Figure 12:
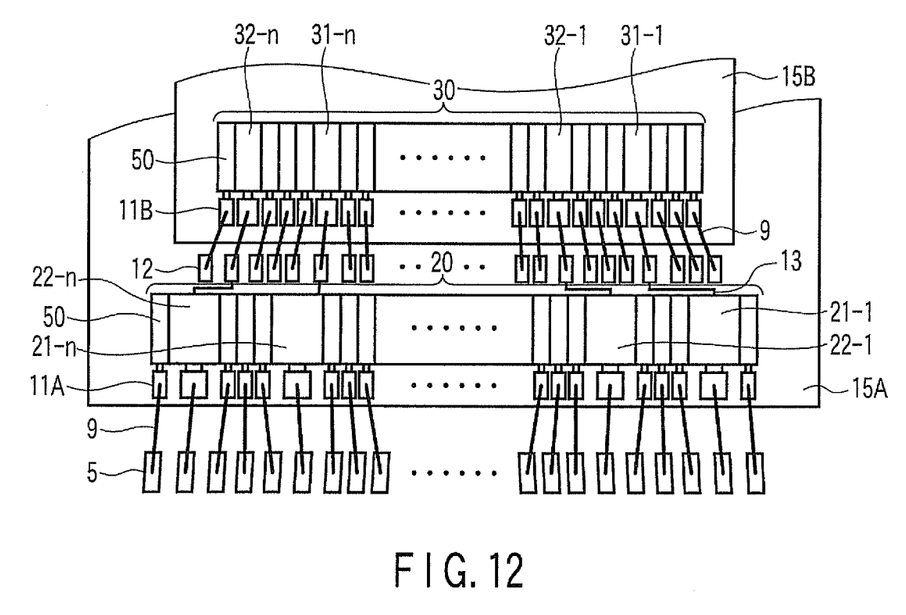
FIG. 12 is a schematic diagram showing one example of the layout of ESD protection elements in the third embodiment.

One structural example of the third embodiment of the present invention is described with FIGS. 10 to 12.

FIG. 10 shows a plan view of the semiconductor device of the present example, and FIG. 11 is a sectional view along line XI-XI in FIG. 10. In addition, members in a depth or forward direction are indicated by broken lines in FIG. 11. Moreover, substrate wiring lines 7 are not shown in FIG. 11. FIG. 12 is a schematic diagram of parts of LSI chips 15A, 15B stacked on a package substrate 1, extracted in the vicinity of internal power supply circuits. In addition, primary internal wiring lines 13 are only shown in FIG. 12.

As shown in FIGS. 10 to 12, the two semiconductor chips 15A, 15B are arranged on the package substrate 1 via a thin insulating sheet (not shown) in a stacked manner.

The semiconductor chips 15A, 15B are, for example, LSI chips. In addition, in the present embodiment as well, the semiconductor chips are not limited to the LSI chips, and may be memory chips or consolidated chips.

Chip pads 11A, 12 are provided in the LSI chip 15A. The chip pad 11A and the chip pad 12 are connected to each other by the internal wiring line 13 provided in the chip 15A.

Furthermore, chip pads 11B are provided in the second LSI chip 15B. The chip pads 11B are connected to the chip pads 12 via bonding wires 9, such that the first LSI chip 15A is electrically connected to the second LSI chip 15B.

Thus, the second LSI chip 15B is connected to an external terminal 6 and an external device (not shown) via the first LSI chip 15A. In addition, while the first LSI chip 15A is connected to the second LSI chip 15B by the bonding wires in the present example, this is not a limitation, and the two LSI chips 15A, 15B may be connected to each other using a solder bump provided on the rear surface of the second LSI chip 15B. A bonding space can be smaller in the case of using the solder bump than in the case of using wire bonding. Thus, the size of the first LSI chip 15A can be smaller.

The first LSI chip 15A has a first internal power supply circuit 20, and a plurality of first ESD protection elements 21-1, 21-n, 22-1, 22-n are provided in the first internal power supply circuit 20. The first ESD protection elements 21-1, 21-n, 22-1, 22-n have a size satisfying the predetermined ESD resistance standard.

The second LSI chip 15B has a second internal power supply circuit 30, and a plurality of second ESD protection elements 31-1, 31-n, 32-1, 32-n are provided in the second internal power supply circuit 30. The second ESD protection elements 31-1, 31-n, 32-1, 32-n are smaller and have lower ESD resistance than the first ESD protection elements 21-1, 21-n, 22-1, 22-n.

The second ESD protection elements 31-1, 31-n, 32-1, 32-n are connected to the first ESD protection elements 21-1, 21-n, 22-1, 22-n via the bonding wire 9 the chip internal wiring lines 13, respectively.

As shown in FIG. 12, the first ESD protection elements 21-1, 21-n, 22-1, 22-n and the second ESD protection elements 31-1, 31-n, 32-1, 32-n are connected, for example, one-to-one. In this case, the second ESD protection elements 31-1, 31-n, 32-1, 32-n are configured to be connected in series or parallel to the first ESD protection elements 21-1, 21-n, 22-1, 22-n via the bonding wire 9 and the chip internal wiring lines 13.

Thus, an ESD breakdown current passes through the first ESD protection elements 21-1, 21-n, 22-1, 22-n or shunted in the first ESD protection elements 21-1, 21-n, 22-1, 22-n, and then supplied to the second ESD protection elements 31-1, 31-n, 32-1, 32-n.

Therefore, the ESD breakdown current is absorbed by the first ESD protection elements 21-1, 21-n, 22-1, 22-n, so that the ESD resistance of the second ESD protection elements 31-1, 31-n, 32-1, 32-n may be smaller than the ESD resistance of the first ESD protection elements. The second ESD protection elements 31-1, 31-n, 32-1, 32-n can be smaller than the first ESD protection elements 21-1, 21-n, 22-1, 22-n.

In addition, in the present example, the plurality of first ESD protection elements 21-1, 21-n, 22-1, 22-n are connected one-to-one to the plurality of second ESD protection elements 31-1, 31-n, 32-1, 32-n in FIG. 12, but a plurality of second ESD protection elements may be connected to one first ESD protection element.

Furthermore, when a plurality of semiconductor chips are stacked, it is necessary to secure a space for the wire bonding of the semiconductor chip located on the lower side, so that it has heretofore been necessary to provide a thick insulating spacer between the lower chip and the upper chip. However, according to the present example, the size of the upper semiconductor chip can be reduced, so that a sufficient space for the wire bonding of the lower semiconductor chip can be secured without using the thick spacer. Thus, the size of the MCP apparatus can be reduced in its thickness direction.

However, in a general MCP apparatus, a chip assembling step is different from a package assembling step. That is, the first LSI chip and the second LSI chip are assembled in one package device after different test steps. It is therefore preferable that the second ESD protection elements of the second LSI chip ensure at least ESD resistance which can resist the test step.

As described above, in the semiconductor device of the present embodiment, the predetermined ESD resistance is ensured and the size of the input/output region of the LSI chip can be reduced even if the size of the second ESD protection element is reduced, as in the first and second embodiments.

Thus, according to the third embodiment of the present invention, the size of the second LSI chip can be reduced, and the size of the MCP apparatus can be reduced. In addition, while the example where two LSI chips are stacked has been described in the present embodiment, the present embodiment is not limited thereto, and three or more chips may be stacked.

(b) Second Structure

Figure 13:
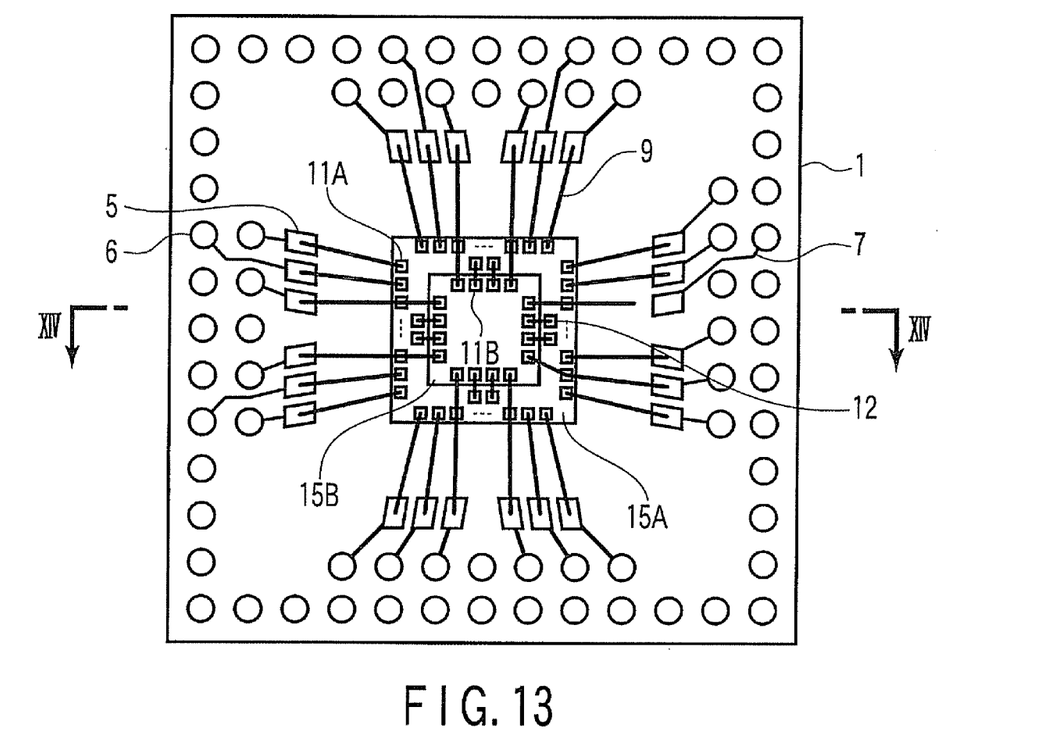
FIG. 13 is a plan view showing one structural example of the third embodiment.
Figure 14:
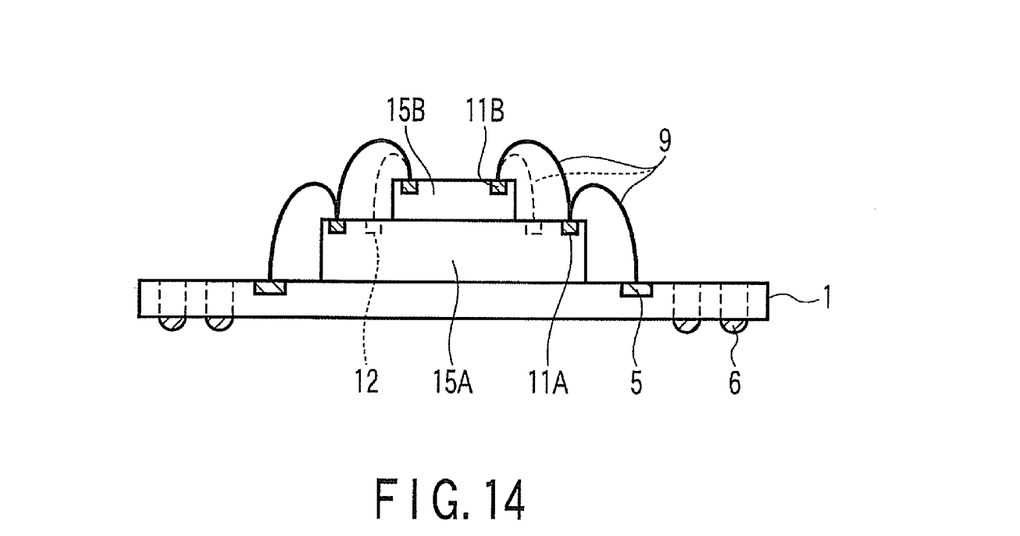
FIG. 14 is a sectional view along line XIV-XIV in FIG. 13.
Figure 15:
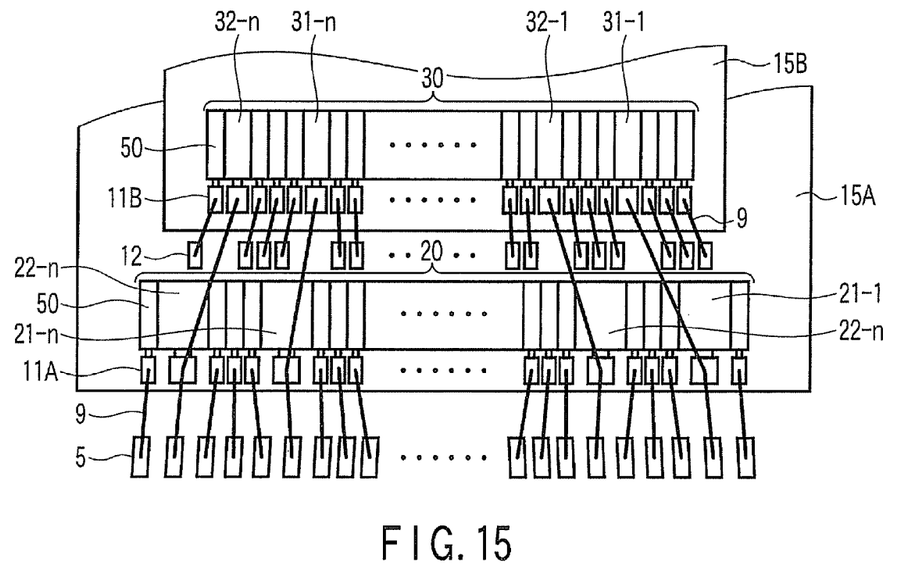
FIG. 15 is a schematic diagram showing one example of the layout of the ESD protection elements in the third embodiment.

One structural example of the third embodiment of the present invention is described with FIGS. 13 to 15. It is to be noted that the same reference numbers are assigned to the same members as those described above and that detailed explanations thereof are omitted.

FIG. 13 shows a plan view of the semiconductor device of the present example, and FIG. 14 is a sectional view along line XIV-XIV in FIG. 13. In addition, members in a depth or forward direction are indicated by broken lines in FIG. 14. Moreover, substrate wiring lines 7 are not shown in FIG. 14. FIG. 15 is a schematic diagram of parts of two LSI chips 15A, 15B stacked on a package substrate, extracted in the vicinity of internal power supply circuits.

The first and second LSI chips 15A, 15B are stacked on a package substrate 1, and are electrically connected to each other by bonding wires 9 and chip pads 12.

As shown in FIG. 15, second ESD protection elements 31-1, 31-n, 32-1, 32-n are connected by the bonding wires 9 to chip pads 11A to which first ESD protection elements 21-1, 21-n, 22-1, 22-n are connected. In this case, the second ESD protection elements 31-1, 31-n, 32-1, 32-n are configured to be connected in parallel to the first ESD protection elements 21-1, 21-n, 22-1, 22-n. Therefore, an ESD breakdown current is supplied to the first and second ESD protection elements in a shunted manner. Thus, the first and second ESD protection elements 21-1, 21-n, 22-1, 22-n, 31-1, 31-n, 32-1, 32-n can be designed to have ESD resistance considering the shunted ESD breakdown current, so that the ESD protection elements can be made smaller.

Therefore, in the present example, not only the second LSI chip 15B but also the first LSI chip 15A can be made smaller.

In addition, as described above, when the semiconductor chips are stacked, it is desirable that the semiconductor chip on the upper side be smaller in order to secure a space for the wire bonding of the semiconductor chip on the lower side. Therefore, it is preferable that the second ESD protection elements are designed to be smaller than the first ESD protection elements.

As described above, in the semiconductor device of the present example, the predetermined ESD resistance can be ensured and the size of the input/output region of the LSI chip can be reduced even if the sizes of the first and second ESD protection elements are reduced.

Thus, according to the third embodiment of the present invention, the sizes of the first and second LSI chips can be reduced, and the size of the MCP apparatus can be reduced.

(c) Third Structure

Figure 16:
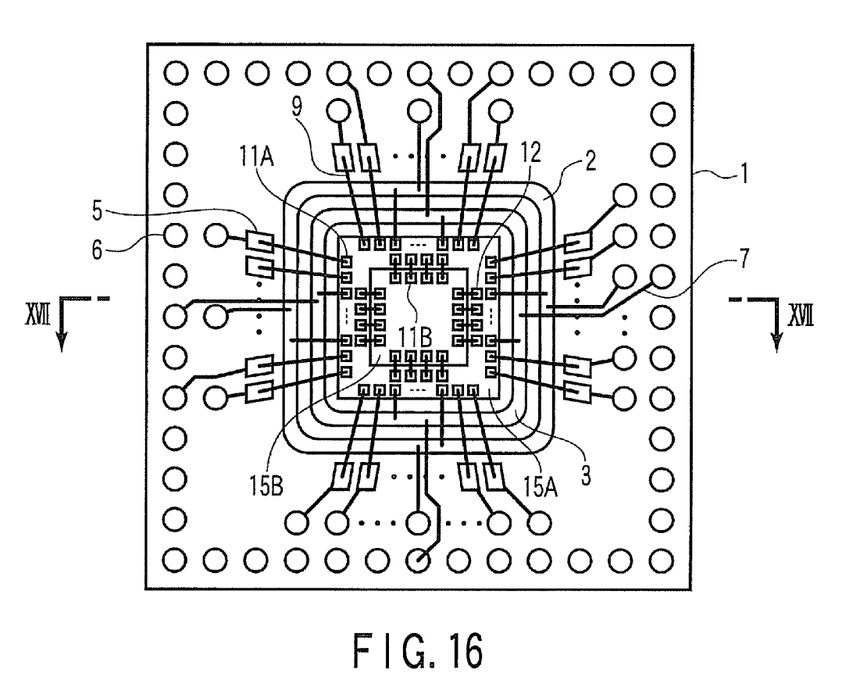
FIG. 16 is a plan view showing one structural example of the third embodiment.
Figure 17:
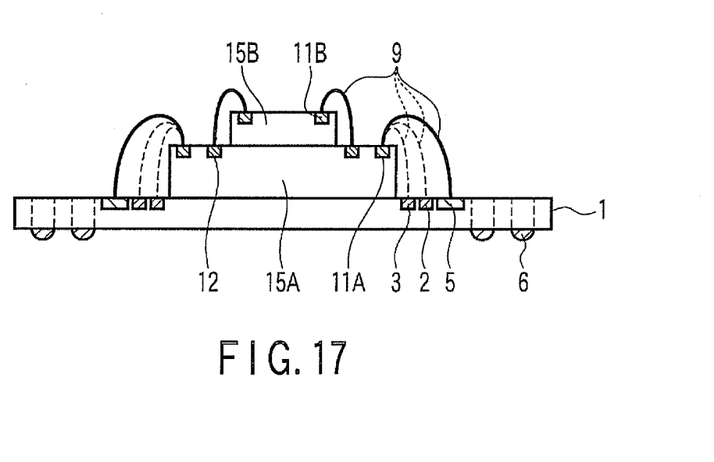
FIG. 17 is a sectional view along line XVII-XVII in FIG. 16.
Figure 18:
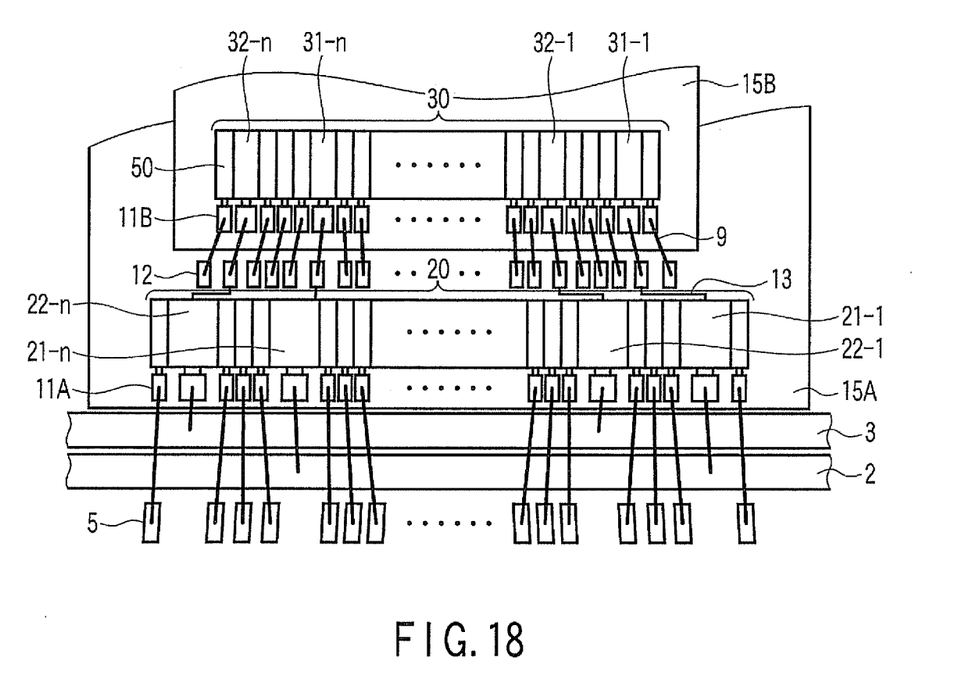
FIG. 18 is a schematic diagram showing one example of the layout of the ESD protection elements in the third embodiment.

One structural example of the third embodiment of the present invention is described with FIGS. 16 to 18. It is to be noted that the same reference numbers are assigned to the same members as those described above and that detailed explanations thereof are omitted.

FIG. 16 shows a plan view of a semiconductor device of the present embodiment, and FIG. 17 is a sectional view along line XVII-XVII in FIG. 16. In addition, members in a depth or forward direction are indicated by broken lines in FIG. 17. Moreover, substrate wiring lines 7 are not shown in FIG. 17. FIG. 18 is a schematic diagram of parts of two LSI chips 15A, 15B stacked on a package substrate 1, extracted in the vicinity of internal power supply circuits.

The first and second semiconductor chips 15A, 15B are stacked on the package substrate 1.

Then, in the present example, power supply rings 2, 3 enclosing the periphery of the stacked LSI chips 15A, 15B are provided on the package substrate 1.

As shown in FIG. 18, second ESD protection elements 31-1, 31-n, 32-1, 32-n are connected to first ESD protection elements via chip internal wiring lines 13. In this case, the second ESD protection elements 31-1, 31-n, 32-1, 32-n are configured to be connected in series or parallel to the first ESD protection elements 21-1, 21-n, 22-1, 22-n via the chip internal wiring lines 13. Thus, an ESD breakdown current is reduced by the first ESD protection elements 21-1, 21-n, 22-1, 22-n, and supplied to the second ESD protection elements 31-1, 31-n, 32-1, 32-n.

Furthermore, the first ESD protection elements 21-1, 21-n, 22-1, 22-n are connected to the common power supply rings 2, 3 for VDD or VSS. Therefore, as in the first embodiment of the present invention, the ESD breakdown current is supplied to the first ESD protection elements 21-1, 21-n, 22-1, 22-n in a shunted manner.

Thus, the first ESD protection elements 21-1, 21-n, 22-1, 22-n can be smaller, and the LSI chip 15A can be made smaller still.

As described above, in the semiconductor device of the present example, a plurality of first ESD protection elements are connected to one common power supply terminal, such that the predetermined ESD resistance can be ensured even if the size of the ESD protection elements is reduced.

Thus, the sizes of the first and second LSI chips can be reduced, and the size of the MCP apparatus can be reduced.

In addition, the second ESD protection elements may be connected to the common power supply rings. Moreover, as shown in the modification of the first embodiment, the power supply rings may be partly cut off and electrically independent of each other.

(d) Fourth Structure

Figure 19:
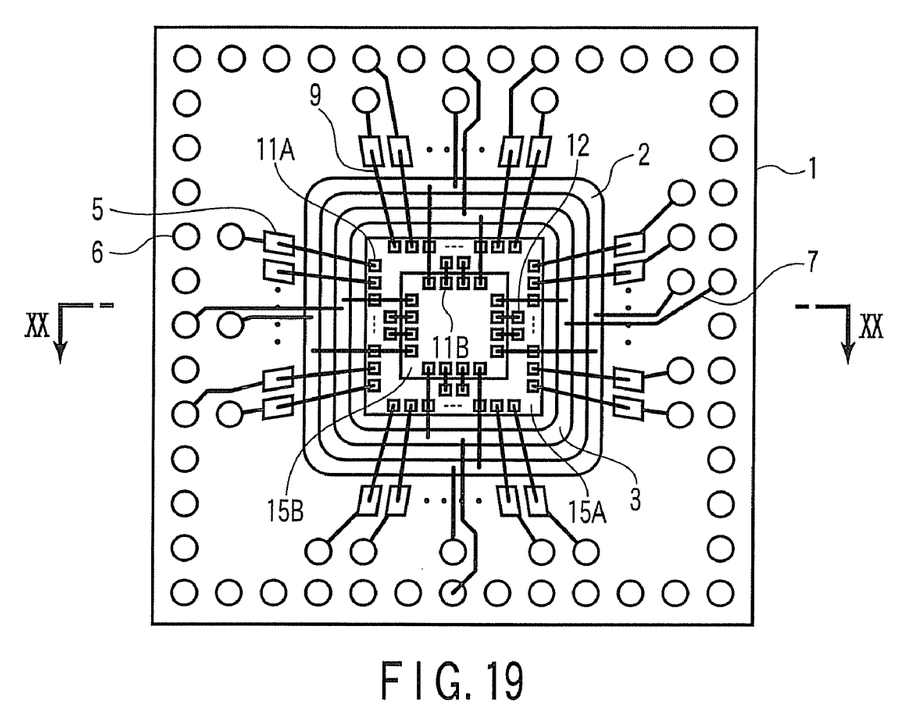
FIG. 19 is a plan view showing one structural example of the third embodiment.
Figure 20:
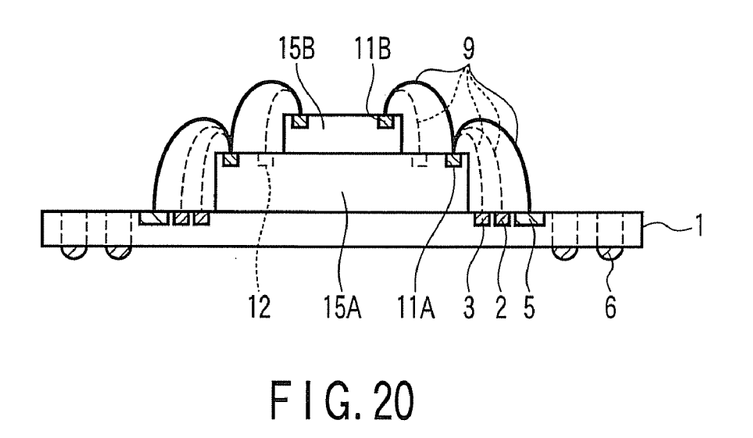
FIG. 20 is a sectional view along line XX-XX in FIG. 19.
Figure 21:
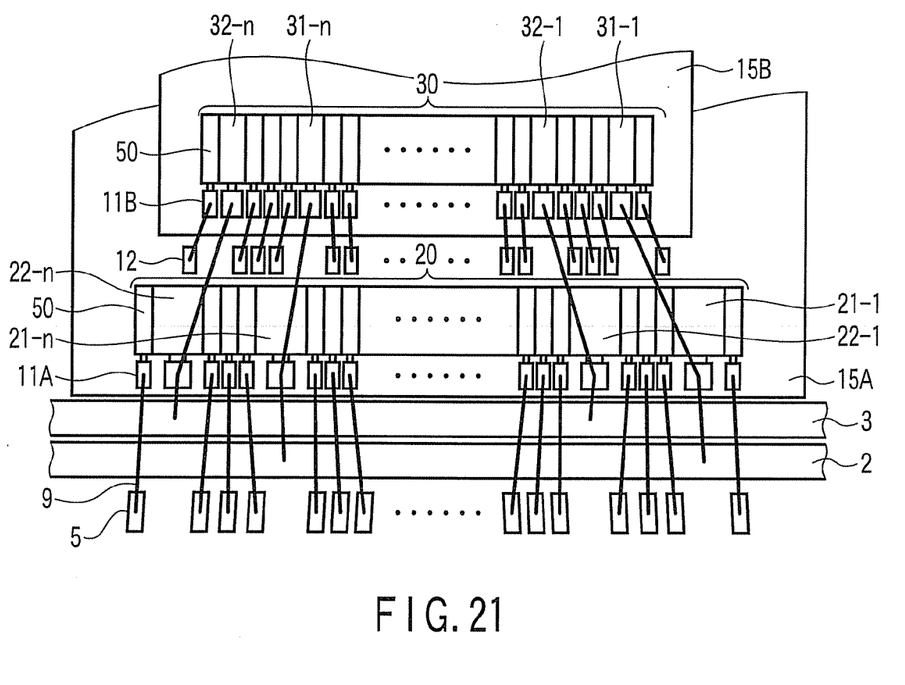
FIG. 21 is a schematic diagram showing one example of the layout of the ESD protection elements in the third embodiment.

One structural example of the third embodiment of the present invention is described with FIGS. 19 to 21. It is to be noted that the same reference numbers are assigned to the same members as those described above and that detailed explanations thereof are omitted.

FIG. 19 shows a plan view of a semiconductor device of the present example, and FIG. 20 shows a sectional view along line XX-XX in FIG. 19. In addition, members in a depth or forward direction are indicated by broken lines in FIG. 20. Moreover, substrate wiring lines 7 are not shown. FIG. 21 is a schematic diagram showing one side of two semiconductor chips 15A, 15B arranged on a package substrate.

As shown in FIGS. 19 and 20, the two LSI chips 15A, 15B stacked on a package substrate 1 having power supply rings, as in the third structure of the present embodiment.

In the present example, as shown in FIG. 21, first ESD protection elements 21-1, 21-n, 22-1, 22-n are connected to second ESD protection elements 31-1, 31-n, 32-1, 32-n by bonding wires 9, as in the second structure. In this case, the second ESD protection elements 31-1, 31-n, 32-1, 32-n are configured to be connected in parallel to the first ESD protection elements 21-1, 21-n, 22-1, 22-n.

Therefore, as in the second structure, an ESD breakdown current is supplied to the first ESD protection elements 21-1, 21-n, 22-1, 22-n and the second ESD protection elements 31-1, 31-n, 32-1, 32-n in a shunted manner. Thus, the second ESD protection elements 31-1, 31-n, 32-1, 32-n can be made smaller.

Furthermore, as in the third structure, the plurality of first ESD protection elements 21-1, 21-n, 22-1, 22-n are connected to common power supply rings 2, 3. Therefore, as the first ESD protection elements are connected to one common power supply ring, the ESD breakdown current is supplied to the respective ESD protection elements in a shunted manner, as in the third structure. Thus, the size of the first LSI chip 15A can also be further reduced as in the third embodiment.

As described above, in the semiconductor device of the present example, a plurality of first and second ESD protection elements are connected to one common power supply terminal, such that the predetermined ESD resistance can be ensured even if the size of the ESD protection elements is reduced.

Thus, according to the third embodiment of the present invention, the sizes of the first and second LSI chips can be reduced, and the size of the MCP apparatus can be reduced.

3. Others

According to the semiconductor devices of the first to third embodiments of the present invention, the ESD resistance of the semiconductor chip can be ensured, and the size of the semiconductor chip can be reduced.

Examples of the present invention are not limited to the embodiments described above, and modifications of components can be embodied without departing from the spirit thereof. Moreover, suitable combinations of a plurality of components disclosed in the embodiments described above permit various inventions to be formed. For example, some of all the components shown in the embodiments described above may be eliminated, or the components in different embodiments may be suitably combined.

What is claimed is:

1. A semiconductor device comprising:
   a package substrate;
   one first power supply terminal provided on the package substrate;
   one second power supply terminal provided on the package substrate;
   a semiconductor chip disposed on the package substrate;
   first and second internal power supply circuits provided in the semiconductor chip;
   one first ESD protection element which is provided in the first internal power supply circuit and which is connected to the first power supply terminal; and
   a plurality of second ESD protection elements, the second ESD protection elements being provided in the second internal power supply circuit, the size of one second ESD protection element being smaller than that of the first ESD protection element, the second ESD protection elements being connected to a common second power supply terminal of the common second power supply terminal.

2. The semiconductor device according to claim 1, wherein the size of each of the plurality of second ESD protection elements is half or less than the size of the first ESD protection element.

3. The semiconductor device according to claim 1, wherein the size of one second ESD protection element is 1/n times the size of the first ESD protection element when the first and second internal power supply circuits have the same ESD resistance standard and the number of the plurality of second ESD protection elements is indicated by n.

4. The semiconductor device according to claim 1, wherein the second power supply terminal is in the shape of a ring enclosing the periphery of the semiconductor chip.

5. The semiconductor device according to claim 1, wherein the semiconductor chip is one of an LSI chip, a memory chip and a embedded chip.

* * * * *